United States Patent
Binkley

(10) Patent No.: US 6,822,506 B2
(45) Date of Patent: Nov. 23, 2004

(54) AMPLITUDE AND RISE-TIME SENSITIVE TIMING-SHAPING FILTERS WITH BUILT-IN PULSE-TAIL CANCELLATION FOR HIGH COUNT-RATE OPERATION

(75) Inventor: David M. Binkley, Charlotte, NC (US)

(73) Assignee: Concorde Microsystems, Inc., Knoxville, TN (US)

( * ) Notice: Subject to any disclaimer, the term of this patent is extended or adjusted under 35 U.S.C. 154(b) by 0 days.

(21) Appl. No.: 10/418,446

(22) Filed: Apr. 17, 2003

(65) Prior Publication Data

US 2004/0027183 A1 Feb. 12, 2004

Related U.S. Application Data

(60) Provisional application No. 60/373,365, filed on Apr. 17, 2003.

(51) Int. Cl.[7] .............................................. H03F 3/191
(52) U.S. Cl. ......................................... 327/551; 330/85
(58) Field of Search ................................ 327/551, 552, 327/553, 554; 330/85, 69

(56) References Cited

U.S. PATENT DOCUMENTS

| 4,443,768 A | | 4/1984 | Nowlin | 327/100 |
| 5,396,187 A | | 3/1995 | Binkley | 327/552 |
| 6,084,465 A | * | 7/2000 | Dasgupta | 327/554 |
| 6,111,467 A | * | 8/2000 | Luo | 330/305 |

OTHER PUBLICATIONS

D. A. Gedcke and W. J. McDonald, "A constant fraction of pulse height trigger for optimum time resolution," Nucl. Instr. Meth., vol. 55, pp. 377–380, 1967.

C. H. Nowlin, "Low–noise lumped–element timing filters with rise–time invariant crossover times," Rev. Sci. Instrum., vol. 63, No. 4, pp. 2322–2326, 1992.

D. M. Binkley, "Performance of Non–Delay–Line Constant–Fraction Discriminator Timing Circuits," IEEE Trans. Nucl. Sci., vol. 41, No. 4, pp. 1169–1175, Aug. 1994.

J. M. Rochelle, D. M. Binkley, and M. J. Paulus, "Fully Integrated Current–Mode CMOS Gated Baseline Restorer Circuits," IEEE Trans. on Nucl. Sci., vol. 42, No. 4, pp. 729–735, Aug. 1995.

(List continued on next page.)

Primary Examiner—Linh M. Nguyen
(74) Attorney, Agent, or Firm—Pitts & Brittian, P.C.

(57) ABSTRACT

A continuous-time baseline restoration (BLR) circuit providing built-in pulse tail-cancellation, or BLR tail-cancel circuit, in constant fraction discriminator (CFD) arming and timing circuits. The BLR tail cancel circuit is applied at the output of constant fraction timing shaping filters and arming circuits to permit monolithic integrated circuit implementation of CFD circuits operating at high input signal count rates. The BLR tail-cancel circuit provides correction of dc offset and count-rate dependent baseline errors along with simultaneous tail-cancellation. Correction of dc offsets due to electronic device mismatches and count-rate dependent baseline errors is required for accurate time pickoff from the input signals. The reduction of pulse width, or pulse tail-cancellation is required to shorten the duration of high count rate signals to prevent the severe distortion caused by the occurrence a new signal superimposed on the tails of previous signals, a condition known as pulse pileup. Without pulse tail-cancellation, there are substantial errors in time pickoff due to the pulse pileup.

20 Claims, 9 Drawing Sheets

OTHER PUBLICATIONS

R. Boie, A. Hrisoho, and P. Rehak, "Signal shaping and tail–cancellation for gas proportional detectors at high counting rates," IEEE Trans. Nucl. Sci., vol. 28, No. 1, pp. 603–609, Mar. 1981.

N. Dressnandt, N. Lam, F. M. Newcomer, R. Van Berg, and H. H. Williams, "Implementation of the ASDBLR straw tube readout ASIC in DMILL technology," IEEE Trans. Nucl. Sci., vol. 48, No. 4, pp. 1239–1243, Aug. 2001.

B. Bevensee, F. M. Newcomer, R. Van Berg, and H. H. Williams, "An amplifiershaper–discriminator with baseline restoration for the ATLAS transition radiation tracker," IEEE Trans. Nucl. Sci., vol. 43, No. 3, pp. 1725–1731, Jun. 1996.

A. Kandasamy, E. O'Brien, P. O'Connor, and W. Von Achen, "A monolithic preamplifier–shaper for measurement of energy loss and transition radiation," IEEE Trans. Nucl. Sci., vol. 46, No. 3, pp. 150–155, Jun. 1999.

M.J. Loinaz & B.A. Wooley, "A CMOS multichannel IC for pulse timing measurements with 1– millivolt sensitivity," IEEE J. Solid–State Circuits, vol. 30, No. 12, pp. 1339–1349, Dec. 1995.

D. M. Binkley, B. S. Puckett, B. K. Swann, J. M. Rochelle, M. S. Musrock, and M. E. Casey, "A 10–Mcps, 0.5 μm CMOS Constant–Fraction Discriminator Having Built–In Pulse Tall–cancellation," IEEE Trans. Nucl. Sci., vol. 49, No. 3, pp. 1130–1140, Jun. 2002.

B. K. Swann, J. M. Rochelle, D. M. Binkley, B. S. Puckett, B. J. Blalock, S. C. Terry, J. W. Young, M. S. Musrock, J. E. Breeding, and K. M. Baldwin, "A Custom Mixed Signal CMOS Integrated Circuit for High Performance PET Tomograph Front–End Applications," IEEE Trans. Nucl. Sci., vol. 50, No. 4, pp. 909–914, Aug. 2003.

* cited by examiner

AMPLITUDE AND RISE-TIME SENSITIVE TIMING-SHAPING FILTERS WITH BUILT-IN PULSE-TAIL CANCELLATION FOR HIGH COUNT-RATE OPERATION

CROSS-REFERENCE TO RELATED APPLICATIONS

This application claims the benefit of U.S. Provisional Application No. 60/373,365, filed Apr. 17, 2003.

STATEMENT REGARDING FEDERALLY SPONSORED RESEARCH OR DEVELOPMENT

Not Applicable.

BACKGROUND OF THE INVENTION

1. Field of Invention

The present invention relates to the field of electrical filters. More specifically, the present invention relates to filtering or shaping circuits that convert input signals of varying amplitude to timing signals having zero crossings that do not vary in time as the input signal varies in amplitude.

2. Description of the Related Art

It is well known that time pickoff circuits are required to accurately mark the arrival time of input signals for systems utilizing time measurement. One such system is positron emission tomography (PET) where it is necessary to measure the arrival times of signals to determine when signals are in time coincidence. Fundamental to accurately marking the arrival time of input signals is the ability to reject the effects of varying single amplitude and, in some cases, varying single rise-time.

The use of simple level discriminators or comparators results in time pickoff that varies with input signal amplitude, the pickoff occurring earlier on the signal for large signals and later on the signal for smaller signals. The variation in time pickoff is known in the art as time walk. Time walk can be present for signals of varying amplitude, varying rise-time, or varying amplitude and rise-time.

A constant fraction discriminator (CFD) provides time pickoff that is insensitive to varying input signal amplitude and, in some cases, varying input signal rise-time. FIG. 1 illustrates the original CFD, a delay-line CFD 100, in which an attenuated version of the input signal is subtracted from a time-delayed version. The delay-line CFD 100 includes a delay line 102, which is a length of line which defines a particular time delay per unit length, to generate the required internal signal delay and an attenuator 104. The output of the attenuator 104 is subtracted from the output of the delay line 102 by a differencer 106. The resulting signal has a zero crossing with a fixed time relationship or delay from the start of the input signal, regardless of the amplitude for fixed-shape input signals. See D. A. Gedcke and W. J. McDonald, "A Constant Fraction of Pulse Height Trigger for Optimum Time Resolution," *Nucl. Instr. Meth.*, vol. 55, pp. 377–380, 1967.

Later, a non-delay-line CFD was reported where a single-pole, high-passed version of the input signal is subtracted from an attenuated version. See C. H. Nowlin, "Amplitude- and Rise-Time-Compensated Filters," U.S. Pat. No. 4,443,768, Apr. 17, 1984; C. H. Nowlin, "Low-Noise Lumped-Element Timing Filters with Rise-Time Invariant Crossover Times," *Rev. Sci. Instrum.*, vol. 63, pp. 2322–2326, 1992. Following Nowlin, a higher-performing, non-delay-line CFD 200, illustrated in FIG. 2, was reported by the present applicant where the output of the attenuator 104 and the output of a low-pass or all-pass filter 202 are combined at the differencer 106. See D. M. Binkley, "Amplitude and Rise-Time Insensitive Timing-Shaping Filters," U.S. Pat. No. 5,396,187, Mar. 7, 1995; D. M. Binkley, "Performance of Non-Delay-Line Constant-Fraction Discriminator Timing Circuits," *IEEE Trans. Nucl. Sci.*, vol. NS 41, no. 4, pp. 1169–1175, August 1994 (describing non-delay-line CFDs in detail). The non-delay-line CFDs, while generally not providing the full performance of the delay-line CFD 100, have the substantial advantage of permitting fully monolithic integration within a single integrated circuit.

The non-delay-line CFD 200 described in U.S. Pat. No. 5,396,187 was extended when implemented in a 2-$\mu$m complementary metal oxide semiconductor (CMOS) integrated circuit by the addition of gated baseline restorer (BLR) circuit. See J. M. Rochelle, D. M. Binkley, and M. J. Paulus, "Fully Integrated Current-Mode CMOS Gated Baseline Restorer Circuits," *IEEE Trans. on Nucl. Sci.*, vol. 42, no. 4, pp. 729–735, August 1995. The gated BLR circuit cancels baseline dc errors associated with MOS transistor mismatches and changing input signal count rates, but does not provide the pulse tail-cancellation revealed in the present application. FIG. 3 illustrates a block diagram of the gated BLR CFD 300, which explicitly seeks to preserved the original shape by only providing correction when a signal is not present. The gated BLR CFD 300 is gated off during the presence of a signal and provides no pulse tail-cancellation. When a signal is not present, the non-delay-line, timing shaping filter output from the shaping filter 302 and the constant fraction comparator 304 is sampled by a transconductor 306. If the sampled signal is not maintained at signal ground, a voltage is developed across a capacitor 308. The capacitor voltage, in turn, causes a correction current $I_{BLR}$ to appear at the input of the shaping filter 302 such that the sampled signal is maintained at signal ground. The gated BLR CFD 300 explicitly seeks to preserve the original signal shape by only providing correction, or being gated on, when a signal is not present. However, conventional CFD circuits, including the gated BLR CFD 300, are not adapted to cancel the slow decay tail of the signal. The inability to cancel the pulse-tail makes conventional CFD circuits unsuitable for use in high count rate applications.

While both delay-line and non-delay-line CFDs exist in the prior art, these circuits do not permit operation for input signals operating at a high count rate. For positron emission tomography (PET) and many systems utilizing nuclear radiation detectors, the detector signal decays slowly following its arrival or leading edge. This decay characteristic is known in the art as the decay tail. If the detector signal count rate is high, it is likely new signals will occur on top of the decay tail of previous signals. The occurrence of a new signal on the decay tail of a previous signal is known in the art as pulse pileup and can create significant time pickoff errors for CFD circuits.

Although not known to be applied to CFD circuits, pulse tail-cancellation circuits for narrowing or effectively canceling the long decay tail of detector signals are known in the prior art. When the decay tail is exponential, as is frequently the case for nuclear scintillation detectors, a pole-zero network or filter can be used to cancel the pole associated with the tail decay by placing a zero at the time constant or frequency associated with the decay tail. See R. Boie, A. Hrisoho, and P. Rehak, "Signal Shaping and Tail-cancellation for Gas Proportional Detectors at High Counting Rates," *IEEE Trans. Nucl. Sci.*, vol. 28, pp. 603–609, March 1981. The pole-zero network will necessarily introduce its own pole, but the time constant associated with the decay tail frequency pole can be made shorter than the original decay tail time constant. If the pole-zero network is tuned to the decay tail of the detector pulse, the pulse tail duration can be reduced considerably. Pole-zero tail-cancellation techniques have been reported in bipolar integrated circuits. See N. Dressnandt, N. Lam, F. M. Newcomer, R. Van Berg, and H. H. Williams, "Implementation of the ASDBLR Straw Tube Readout ASIC in DMILL Technology," IEEE Trans. Nucl. Sci., vol. 48, pp. 1239–1243, August 2001; B. Bevensee, F. M. Newcomer, R. Van Berg, and H. H. Williams, "An Amplifier-Shaper-Discriminator with Baseline Restoration for the ATLAS Transition Radiation Tracker," IEEE Trans. Nucl. Sci., vol. 43, pp.1725–1731, June 1996. Other pole-zero tail-cancellation techniques have been applied to CMOS integrated circuits. See A. Kandasamy, E. O'Brien, P. O'Connor, and W. Von Achen, "A Monolithic Preamplifier-Shaper for Measurement of Energy Loss and Transition Radiation," IEEE Trans. Nucl. Sci., vol. 46, pp.150–155, June 1999. These techniques are designed to reduce the long ion decay tail associated with proportional chamber detectors. However, pole-zero tail-cancellation techniques have the disadvantage of requiring tuning or matching to the signal decay time constant.

If the zero of a pole-zero network or filter is placed at the origin (0 Hz or dc), the circuit reduces to a single-pole high-pass filter. Such a circuit has the advantage of reducing the signal decay tail duration while not requiring specific tuning to the decay tail characteristics. Additionally, the single-pole high-pass filter circuit simultaneously blocks dc signals, including CMOS transistor mismatch related voltages, which can result in significant time pickoff errors in practical CFD applications. A single-pole high-pass filter circuit is used in a CMOS integrated circuit for canceling the decay associated with straw tube ionization chambers. See M. J. Loinaz and B. A. Wooley, "A CMOS Multichannel IC for Pulse Timing Measurements with 1-mV Sensitivity," IEEE J. Solid-State Circuits, vol. 30, pp. 1339–1349, December 1995.

However, it is not known to have pulse tail-cancellation applied directly to CFD circuits permitting accurate time pickoff of signals operating at high count rate. It is desirable to provide continual, aggressive correction in such a way as to simultaneously correct dc baseline errors and cancel the slow decay tail of the signal. This would permit operation at extremely high count rates otherwise not possible.

In summary, the original delay-line CFD, the Nowlin non-delay-line CFD, the Binkley non-delay-line CFD, and the Rochelle, et al., non-delay-line CFD with gated BLR (the Rochelle, et al. paper) all describe prior embodiments of CFD circuits but these are gated BLR's that in no way provide pulse tail cancellation for high count rate operation. While tail-cancellation circuits exist in the prior art in fields unrelated to CFD circuits, tail-cancellation circuits have not been applied to or integrated with CFD circuits.

Accordingly, it is an object of the present invention to apply continuous-time, baseline restorer (BLR) circuits to existing CFD circuits in both the constant fraction or zero-crossing timing path and the arming path.

Another object of the present invention is that the continuous-time, BLR circuits regulate the baseline for the constant fraction or zero crossing signal and for the arming signal in CFD circuits to correct for baseline shift associated with varying input pulse count rate and device mismatch errors in integrated circuit implementations.

A further object of the present invention is that the continuous-time, BLR circuits provide simultaneous pulse-tail cancellation (providing a significant reduction in the width or duration) for the zero-crossing signal and for the arming signal in CFD circuits to permit CFD circuits to operate at very high count rates.

It is a still further object of the present invention that the continuous-time, BLR circuits provide simultaneous pulse-tail cancellation in a way where the initial portion of the zero-crossing and the arming signals is minimally affected to obtain accurate zero-crossing time discrimination and arming threshold discrimination.

BRIEF SUMMARY OF THE INVENTION

A constant fraction discriminator (CFD) having built-in pulse tail-cancellation is shown and described herein. The CFD combines constant fraction shaping, arming, and baseline restoration with pulse tail-cancellation to produce a CFD capable of high count rate operation. The filter or shaping circuits described herein are insensitive to varying amplitude for arbitrary fixed-shaped input signals having a very high count rate. The CFD provides correction of dc offset and count-rate dependent baseline errors along with simultaneous tail-cancellation. Correction of dc offsets due to electronic device mismatches and count-rate dependent baseline errors is required for accurate time pickoff from the input signals. The reduction of pulse width, or pulse tail-cancellation is required to shorten the duration of high count rate signals to prevent the severe distortion caused by the occurrence a new signal superimposed on the tails of previous signals, a condition known as pulse pileup. Without pulse tail-cancellation, there are substantial errors in time pickoff due to the pulse pileup. The addition of pulse tail-cancellation permits operation of the CFD at high count rates without pulse pileup. Operation of the CFD at high count rates is significant for various applications, including positron emission tomography (PET) medical imaging scanners that utilize large area detectors.

FIG. 4 illustrates one embodiment of the CFD having built-in pulse tail-cancellation. The input to the CFD is processed in two parallel signal paths. The lower signal path contains a CF shaping filter which generates an output signal having zero crossing time that is independent of the input signal amplitude. The lower signal path includes a CF shaping filter, a CF baseline restorer (BLR) and pulse-tail-cancellation circuit, and a CF comparator. The upper signal path includes an arming BLR and pulse-tail-cancellation circuit and an arming comparator. The outputs of the CF comparator and the arming comparator are processed by the arming logic to provide a time pickoff logic signal having a fixed time relationship from the zero crossing of the signal at the input of the CF comparator. This results in time pickoff that is insensitive to varying amplitude at the CFD input.

The output of the CF shaping filter is connected to a continuous-time CF BLR tail-cancel circuit. The CF BLR tail-cancel circuit cancels dc baseline errors due to circuit offsets and baseline shift associated with varying input signal count rates. Additionally, the CF BLR tail-cancel circuit provides built-in signal decay tail-cancellation through continuous-time, wideband, negative feedback. The pulse-tail-cancellation, needed for high count-rate operation, is illustrated at the CF BLR tail-cancel circuit output. The CF BLR tail-cancel circuit holds the CF signal baseline near zero, except for the initial portion of its input signal. The CF comparator senses the zero crossing of the output of the CF BLR tail-cancel circuit providing the needed amplitude-independent time pickoff and producing a time pickoff logic output signal. Similarly, the arming BLR tail-cancel circuit cancels dc baseline errors due to circuit offsets and baseline shift associated with varying input signal count rates. Additionally, the arming BLR tail-cancel circuit provides built-in signal decay tail-cancellation through its continuous-time, wideband, negative feedback. However, unlike the CF BLR tail-cancel circuit, the arming BLR tail-cancel circuit holds the arming signal baseline below zero by an amount equal to a selected arming threshold. When the output of the arming BLR tail-cancel circuit exceeds the preset threshold, it crosses through zero and is detected by the arming comparator. The arming comparator provides an arming logic output signal.

BRIEF DESCRIPTION OF THE SEVERAL VIEWS OF THE DRAWINGS

The above-mentioned features of the invention will become more clearly understood from the following detailed description of the invention read together with the drawings in which.

DETAILED DESCRIPTION OF THE INVENTION

A constant fraction discriminator (CFD) having built-in pulse tail-cancellation is shown generally at 400 in the figures and described herein. The CFD 10 combines constant fraction shaping, arming, and baseline restoration with pulse-tail-cancellation to produce a CFD 400 capable of high count rate operation. The filter or shaping circuits described herein are insensitive to varying amplitude for arbitrary fixed-shaped input signals having a very high count rate. The CFD 400 provides correction of dc offset and count-rate dependent baseline errors along with simultaneous tail-cancellation. Correction of dc offsets due to electronic device mismatches and count-rate dependent baseline errors is required for accurate time pickoff from the input signals. The reduction of pulse width, or pulse tail-cancellation, is required to shorten the duration of high count rate signals to prevent the severe distortion caused by the occurrence a new signal superimposed on the tails of previous signals, a condition known as pulse pileup. Without pulse tail-cancellation, there are substantial errors in time pickoff due to the pulse pileup. Thus the slow decaying tail component from nuclear or other detectors is effectively reduced or cancelled while maintaining the critical amplitude and time information in the early portion of the signal.

The signal tail-cancellation is provided by high-bandwidth, continuous-time negative feedback. The signal tail-cancellation significantly reduces the duration of the output signals at the arming BLR tail-cancel output and the CF BLR tail-cancel output compared to the detector input signal. The addition of pulse tail-cancellation permits operation of the CFD 400 at high count rates without pulse pileup. Operation of the CFD 400 at high count rates is significant for various applications, including positron emission tomography (PET) medical imaging scanners that utilize large area detectors.

Figure 4:
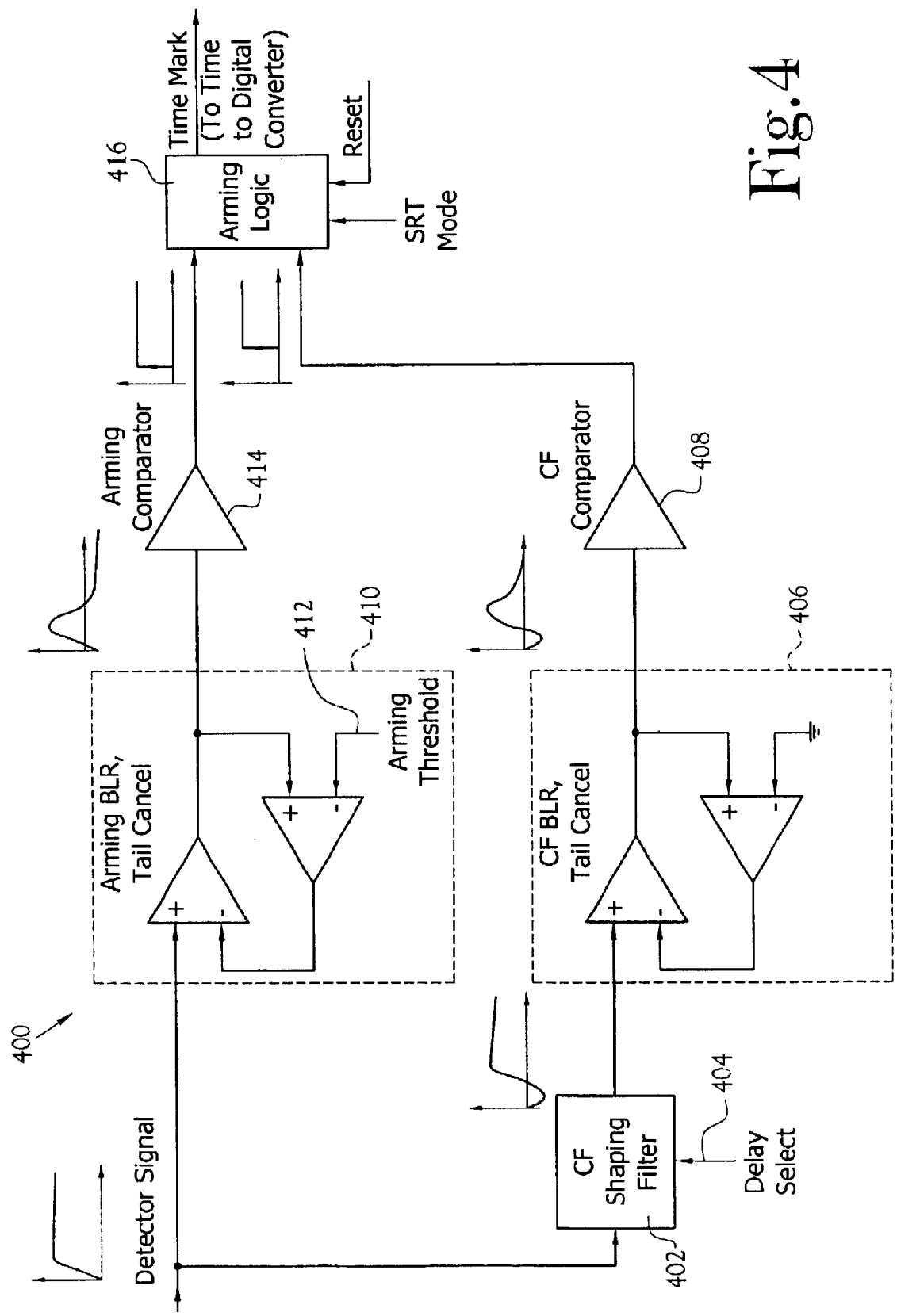
FIG. 4 is a block diagram of a constant fraction discriminator (CFD) circuit capable of operation at high count rates according to the present invention.

FIG. 4 illustrates a block diagram of one embodiment of the CFD 400. The input to the CFD 400 is an input signal having a plurality of events occurring at a high count rate, i.e., a plurality of pulses each having a long decay tail. The input is processed in two parallel signal paths. The lower signal path contains a CF shaping filter which generates an output signal having zero crossing time that is independent of the input signal amplitude. The lower signal path includes a CF shaping filter 402, a CF baseline restorer (BLR) and pulse-tail-cancellation circuit 406, and a CF comparator 408. The upper signal path includes an arming BLR and pulse-tail-cancellation circuit 410 and an arming comparator 414. The outputs of the CF comparator 408 and the arming comparator 414 are processed by the arming logic 416 to provide a time pickoff logic signal having a fixed time relationship from the zero crossing of the signal at the input of the CF comparator 408. This results in time pickoff that is insensitive to varying amplitude at the CFD input.

The CF shaping filter 402 utilizes a non-delay-line constant-fraction discriminator (CFD) circuit where an attenuated version of the input signal is subtracted from a low-pass filtered and delayed version of the input signal. Inside the CF shaping filter 402, a five-pole low-pass filter provides the needed signal delay, replacing the delay line used in the traditional delay-line CFD. A delay-select line 404 allows the time delay to be selected at nominally 4.5 or 7.5 nanoseconds to accommodate either fast or slow rise-time photomultiplier tubes used in scintillation detectors for a positron emission tomography (PET) system application. The amplitude- and rise-time insensitive CF shaping filter 402 converts a selected input signal into a bipolar output signal having a zero-crossing time that is independent of amplitude and, in some cases, rise-time of the input signal, which is used for time pickoff of input signals that is free from time walk errors associated with varying input signal amplitudes and, in some cases, rise-time. The bipolar output of the CF shaping filter 402 is connected to a continuous-time CF BLR tail-cancel circuit 406. The CF BLR tail-cancel circuit 406 cancels dc baseline errors due to circuit offsets and baseline shift associated with varying input signal count rates. Additionally, the CF BLR tail-cancel circuit 406 provides built-in signal decay tail-cancellation through continuous-time, wideband, negative feedback. The pulse-tail-cancellation, needed for high count-rate operation, is illustrated at the CF BLR tail-cancel circuit 406 output. The baseline restoration and tail cancellation is accomplished without disturbing the input signal by comparing the CF timing-shaping filter output with a reference voltage while providing continuous-time, wideband, high-frequency negative feedback signal that attempts to hold the CF timing-shaping output signal at the reference voltage. The CF BLR tail-cancel circuit 406 holds the CF signal baseline near zero, except for the initial portion of its input signal. The CF comparator 408 senses the zero crossing of the output of the CF BLR tail-cancel circuit 406 providing the needed amplitude-independent time pickoff and producing a time pickoff logic output signal.

Like the CF BLR tail-cancel circuit 406 in the lower signal path, the arming BLR tail-cancel circuit 410 cancels dc baseline errors due to circuit offsets and baseline shift associated with varying input signal count rates. Additionally, the arming BLR tail-cancel circuit 410 provides built-in signal decay tail-cancellation through its continuous-time, wideband, negative feedback. The reduction of pulse width is shown at the output of the arming BLR tail-cancel circuit 410. However, unlike the CF BLR tail-cancel circuit 406, the arming BLR tail-cancel circuit 410 holds the arming signal baseline below zero by an amount equal to a selected arming threshold 412. When the output of the arming BLR tail-cancel circuit 410 exceeds the preset threshold, it crosses through zero and is detected by the arming comparator 414. The arming comparator 414 provides an arming logic output signal.

Both the arming comparator 414 and CF comparator 408 communicate with the arming logic 416. The arming logic 416 permits a CFD output only for signals that exceed the preset threshold at the arming comparator 414. Two types of operation are supported: traditional arming where the CFD output is present whenever both arming and timing zero-crossing detection occur and slow rise-time reject (SRT) arming where the output is present only if arming precedes zero-crossing timing detection. In the present invention, a logical AND circuit is used for traditional arming to combine the arming and CF logic signals. A logical D flip flop is used for SRT arming where the arming logic signal is connected to the D input and the CF logic signal is connected to the clock input.

Because the BLR tail-cancel circuits 406, 410 operate at the arming and CF channel outputs, all accumulated errors within the arming and CF circuits, prior to the arming and CF comparators, are cancelled. The reduction of accumulated errors is especially advantageous for monolithic CMOS implementations where significant dc mismatch errors are typically present in the transistor devices.

Figure 1:
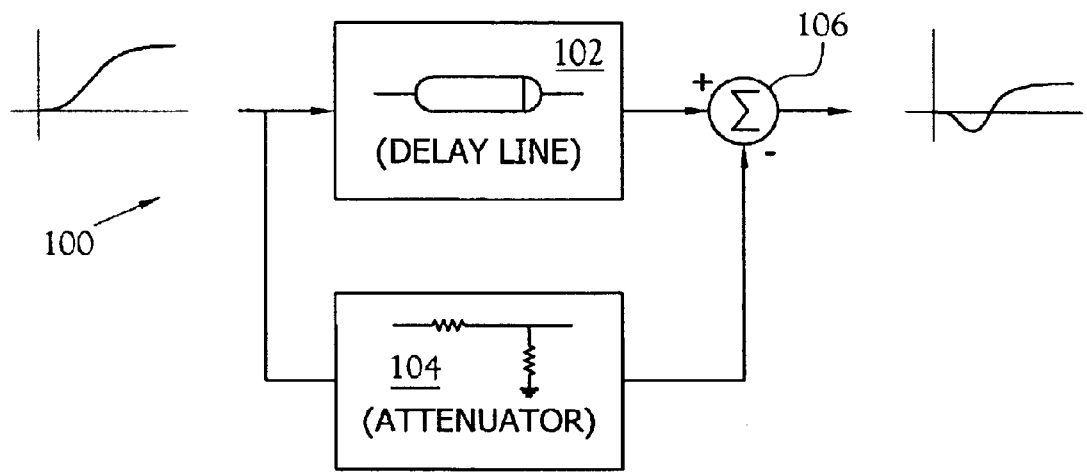
FIG. 1 is a block diagram illustrating a conventional delay-line constant-fraction shaping filter.
Figure 2:
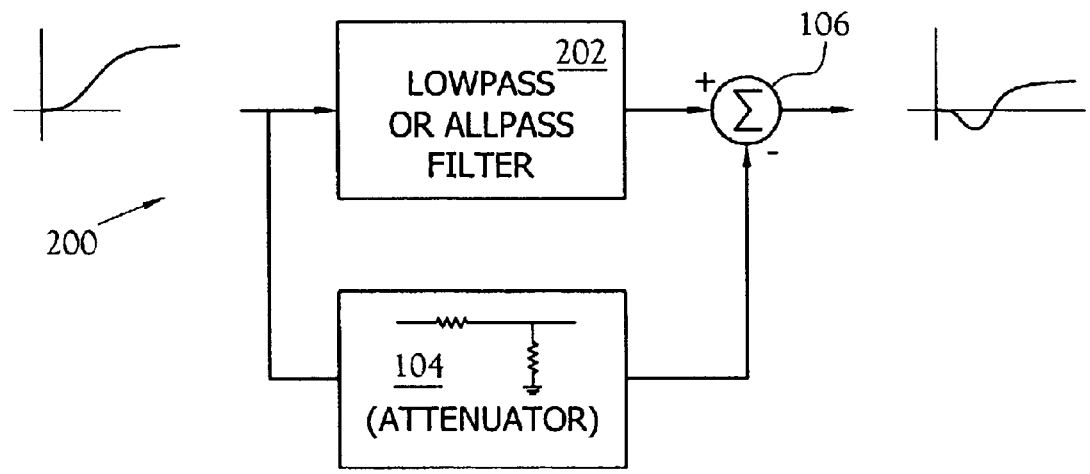
FIG. 2 is a block diagram illustrating a conventional non-delay-line constant-fraction shaping filter.
Figure 3:
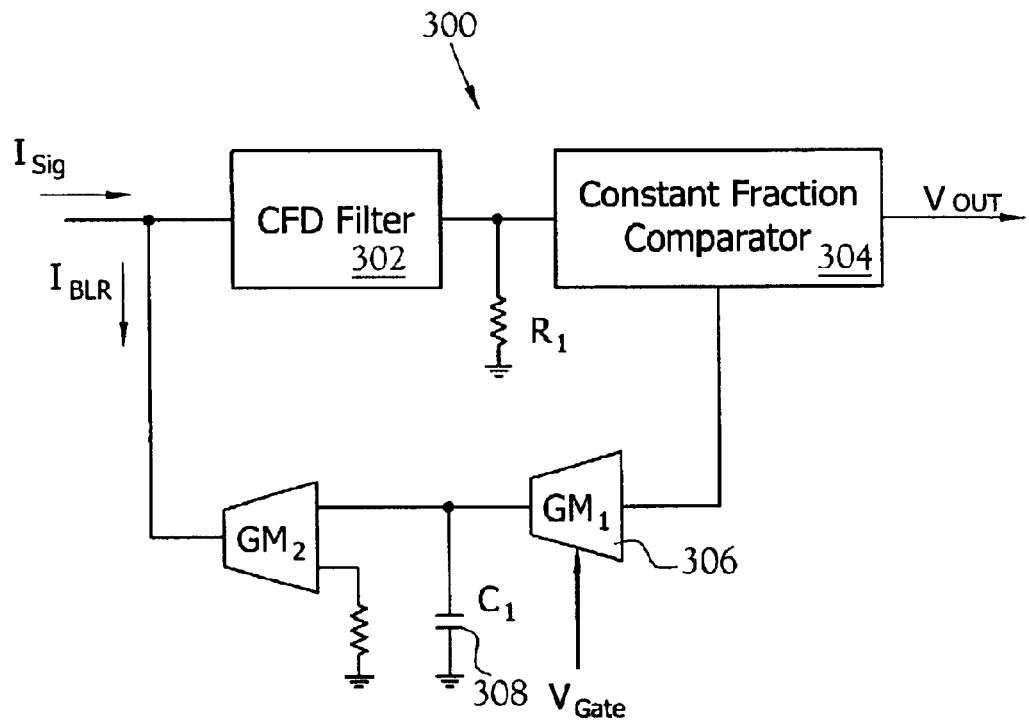
FIG. 3 is a block diagram illustrating a conventional non-delay-line constant-fraction shaping filter having a gated baseline restorer extension for canceling dc baseline errors.
Figure 5:
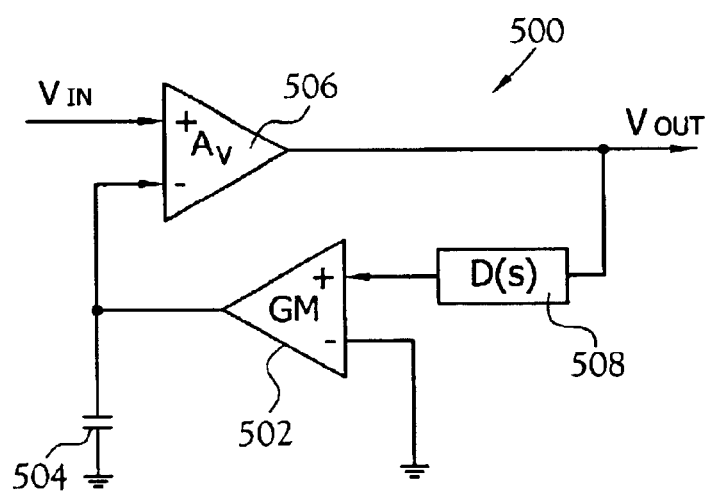
FIG. 5 is a block diagram of the present invention showing the BLR tail-cancel circuits of FIG. 4 in greater detail.

FIG. 5 shows a block diagram of the general negative-feedback circuit which makes up the BLR tail-cancel circuit 500 of the present invention. In the general BLR tail-cancel circuit 500, the error between the BLR output signal and a baseline reference causes output current from transconductor 502. The output current charges a capacitor 504. By changing the voltage of the capacitor 504, the BLR output error is cancelled through difference amplifier 506. Delay element 508 provides a sampling delay, D(s), to minimize BLR cancellation of the input signal leading edge. In the illustrated embodiment, the capacitor 504 is represented by a fixed capacitor; however, those skilled in the art recognize that a tunable compensation capacitor, tunable electronic devices, or any tunable elements that may be adjusted initially during fabrication, adjusted periodically, or adjusted on-demand in response to changing circuit requirements can be used to match the compensation capacitor 504 for proper operation.

The delay element 508 delays the timing-shaping filter output signal appearing at the sampling circuit input thereby minimizing negative feedback cancellation of the leading edge or early time information of the timing-shaping filter output signal. The delay element 508 may consist of delay lines, active or passive low-pass and/or all-pass filters providing delay, passive resistor (R) capacitor (C) circuits providing delay at the input of the sampling circuit such that no dc errors occur if connected to the input of solid-state devices having no dc input currents, inherent circuit delays provided by circuit low-pass poles in the sampling circuit, and combinations of any of the aforementioned delay circuits.

If the sampling delay is not present, i.e., D(s)=1, the BLR tail-cancel circuit 500 has response given by $$\frac{V_{OUT}}{V_{IN}}(s) = A_V \frac{\tau_{HP}s}{1+\tau_{HP}s}, \quad \text{where} \tag{1}$$

$$\tau_{HP} = \frac{C}{A_V G_M}. \tag{2}$$

The BLR tail-cancel response in Equation 1 is equal to the response of a single-pole CR high-pass filter having gain of $A_V$ and time constant of $\tau_{HP}$ as given in Equation 2. If an exponentially decaying scintillation detector signal with zero rise-time is applied to the BLR tail-cancel circuit 500 with $A_V=1$, the resulting output signal response is given by $$V_{OUT}(s) = \frac{\tau_S}{1+\tau_S s} \cdot \frac{\tau_{HP}s}{1+\tau_{HP}s}, \tag{3}$$

where $\tau_S$ is the scintillator decay time constant. The time-domain output signal for t>0 is then given by $$v_{out}(t) = \left[\frac{\tau_S}{\tau_S - \tau_{HP}}\right]e^{-\frac{t}{\tau_{HP}}} - \left[\frac{\tau_{HP}}{\tau_S - \tau_{HP}}\right]e^{-\frac{t}{\tau_S}}. \tag{4}$$

Figure 6:
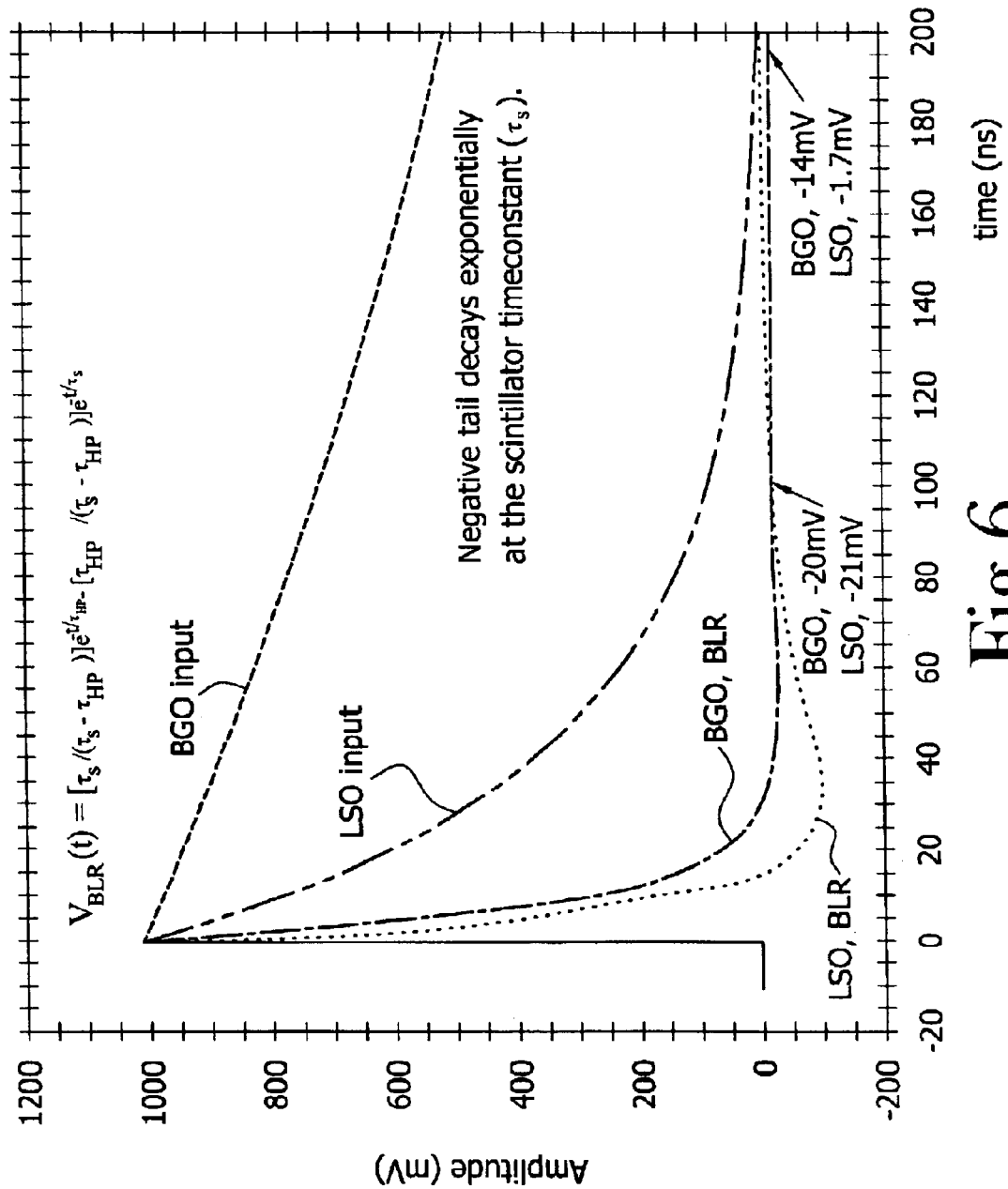
FIG. 6 shows shortening (pulse tail-cancellation) of zero-nanosecond rise-time signals by the BLR tail-cancel circuit of the present invention for both BGO and LSO detector signals used in PET medical imaging.

If $\tau_{HP} \ll \tau_S$, effective pulse tail-cancellation is possible where the first term in Equation 4 is a desired, near-unity, positive-decaying exponential having the shorter high-pass time constant, $\tau_{HP}$, and the second term is an undesired, much smaller, negative-decaying exponential tail having the longer scintillator time constant $\tau_S$. FIG. 6 plots the input signals from a PET detector for bismuth germinate oxide (BGO) and lutetium oxyorthosilicate (LSO) and the output signals from the BLR tail-cancel circuit 500 having an eight-nanosecond high-pass time constant. Note that the BLR tail-cancel circuit 500 substantially cancels the decay tail of the input signal, substantially shortening the duration of the signal.

At high count rates, the undesired exponential tail, expressed by the second term in Equation 4, results in a baseline shift that can be expressed as a fraction of the desired signal peak, expressed by first term in Equation 4. For a periodic count rate having period T, the fraction is found from the sum of previous pulse decay tails and is given by $$\frac{V_{BASELINE}}{V_{SIGNAL}} = -\frac{\tau_{HP}}{\tau_S} \sum_{n=1}^{\infty} e^{\frac{-nT}{\tau_S}}. \quad (5)$$

For a BLR tail-cancel high-pass time constant of eight nanoseconds ($\tau_{HP}$=8 ns) and a periodic count rate of 10 MHz (T=100 nanoseconds), Equation 5 gives a baseline error of −1.8% for LSO ($\tau_S$=40 ns) and −6.7% for BGO ($\tau_S$=300 ns) signals. The baseline error without the BLR would be much higher at +8.9% for LSO and +253% for BGO signals as given by the summation in Equation 5 without the multiplier of −$\tau_{HP}/\tau_S$.

Figure 7:
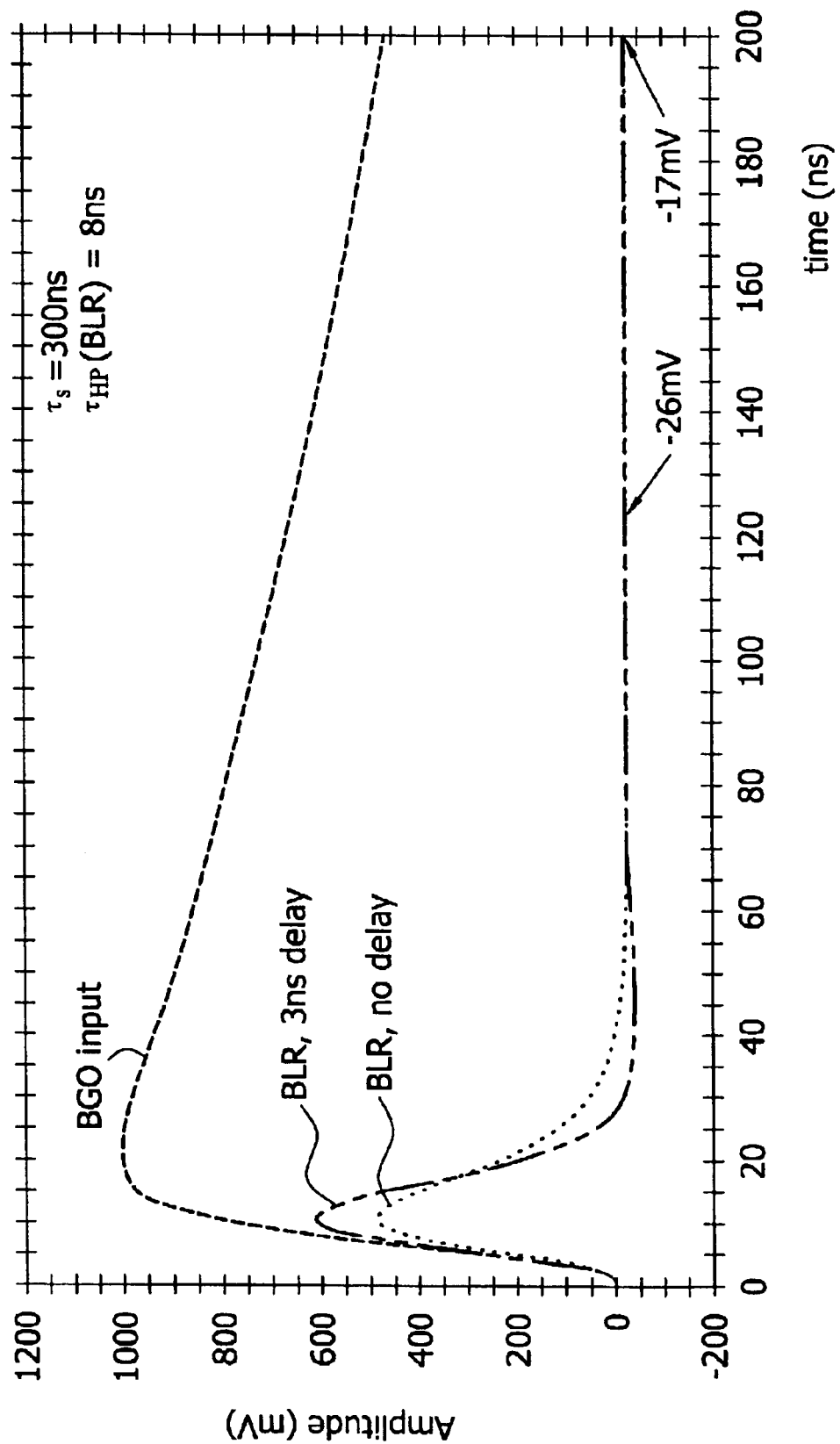
FIG. 7 shows pulse tail-cancellation of ten-nanosecond rise-time signals by the arming BLR tail-cancel circuit of FIG. 4 for a sampling delay of zero and three nanoseconds.

The detector signal connecting to the arming BLR tail-cancel circuit 410 has finite rise-time due to the rise-time of the detector photomultiplier tube and subsequent amplification stages. The detector signal rise-time (10–90%) is approximately ten nanoseconds and is modeled here by a zero rise-time signal applied to a low-pass filter consisting of three real, 2.5-nanosecond poles. When the ten-nanosecond rise-time signal is applied to the arming BLR tail-cancel circuit 410, some cancellation occurs along the leading edge of the signal. The addition of a sampling delay, D(s), reduces the leading-edge signal loss. Sampling delay is introduced by three real, one-nanosecond poles. FIG. 7 illustrates the arming BLR tail-cancel output for BGO detector signals having ten-nanosecond rise-times. The output is shown with and without the three-nanosecond sampling delay for an arming BLR tail-cancel high-pass time constant of eight nanoseconds. There is a 28% increase in output signal level when the sampling delay is included. At 100 nanoseconds, the baseline error is −17 millivolts or −4.4% relative to the peak output signal, with or without the sampling delay. Increasing the sampling delay somewhat above 3 nanoseconds would increase the arming BLR tail-cancel output signal level with little effect on pulse tail-cancellation. However, the sampling delay introduces extra phase shift in the arming BLR tail-cancel negative feedback loop affecting feedback stability and response.

Figure 8:
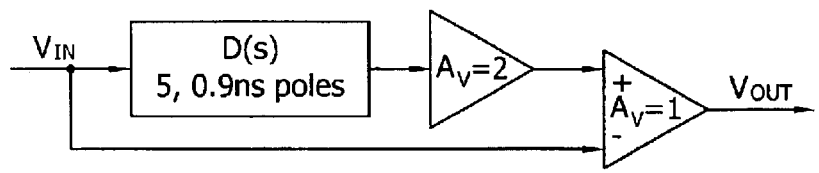
FIG. 8 shows a block diagram of a CF non-delay-line, timing-shaping filter of FIG. 4 in greater detail.

The detector signal connects to the CF non-delay-line, timing-shaping filter of FIG. 4 just as it connects to the arming BLR tail-cancel circuit. Again, the rise-time of the detector signal is approximately ten nanoseconds for the PET medical imaging application initially considered. The CF non-delay-line timing-shaping filter, illustrated in FIG. 8, subtracts the input signal from a delayed version of the input signal, which has a gain of two, to create a bipolar signal having a zero crossing time that is independent of the input signal amplitude. The non-delay-line CFD circuit, utilizing a signal fraction of one-half and delay provided by multiple real poles, lends itself to monolithic CMOS implementation using a current-mode low-pass delay circuit.

Figure 9:
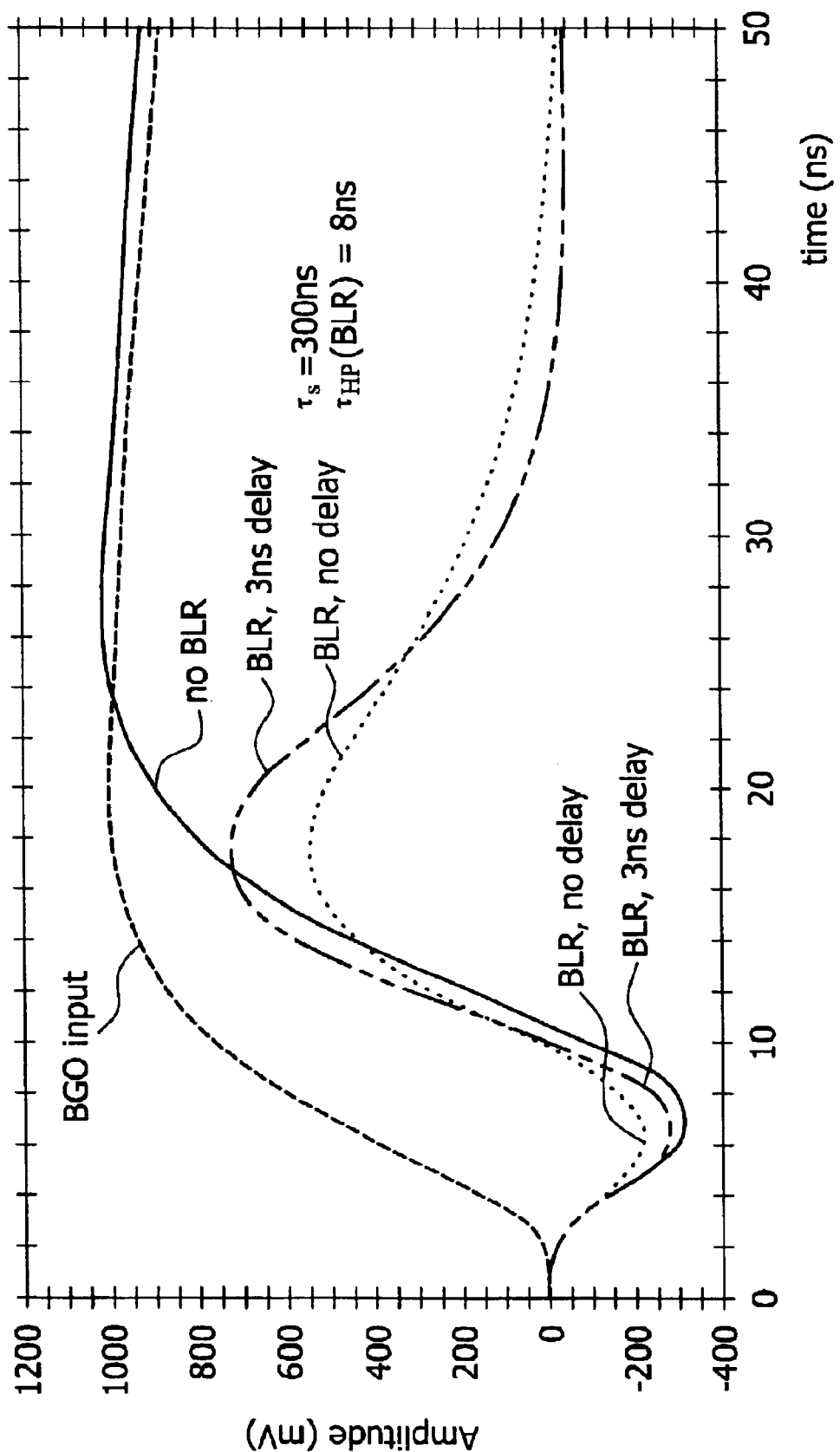
FIG. 9 shows pulse tail-cancellation by the CF BLR tail-cancel circuit of FIG. 4 for a sampling delay of zero and three nanoseconds.

Like the upper arming channel of FIG. 4 previously described, the lower CF channel also utilizes a BLR tail-cancel circuit 406 to cancel circuit dc offsets and provide pulse tail-cancellation. The CF BLR tail-cancel circuit 406 is identical to the arming BLR tail-cancel circuit 410 and is driven from the CF non-delay-line, timing-shaping filter 402, which is driven from ten-nanosecond rise-time signals. FIG. 9 illustrates the CF BLR tail-cancel output for BGO detector signals resulting from ten-nanosecond rise-time detector signals connected to the CF non-delay-line, timing shaping filter. Again, the output is shown with and without the three-nanosecond sampling delay for a CF BLR tail-cancel high-pass time constant of eight nanoseconds. There is a 33% increase in output signal level when the sampling delay is included. At 100 nanoseconds (not shown in FIG. 9), the baseline error is −3.7%, relative to the peak output signal, with the sampling delay.

Figure 10:
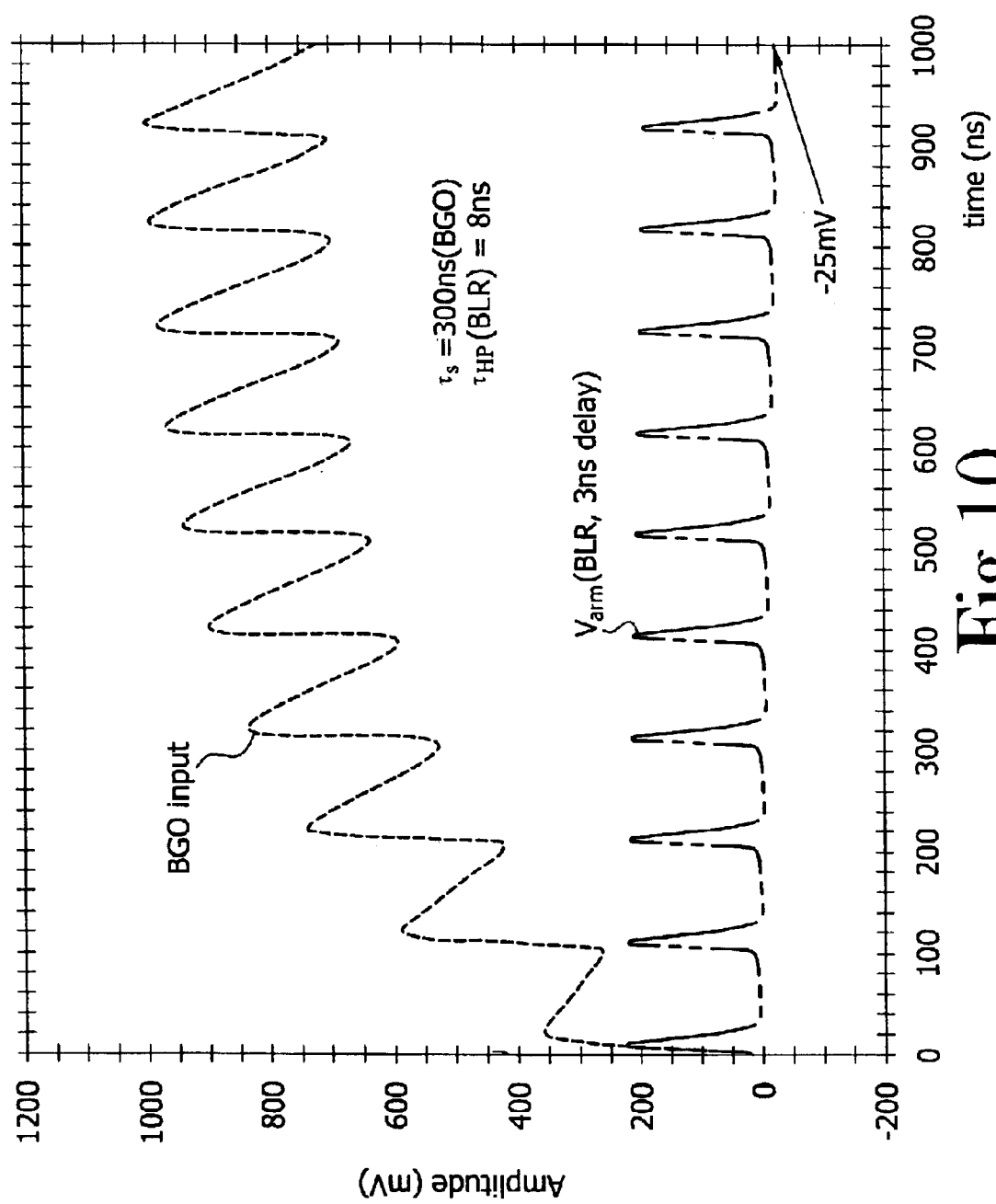
FIG. 10 shows both pulse tail-cancellation by the arming BLR tail-cancel circuit of FIG. 4 and the severe pulse pileup when the BLR tail-cancel circuit is not used for BGO detector signals at a periodic count rate of 10 MHz.
Figure 11:
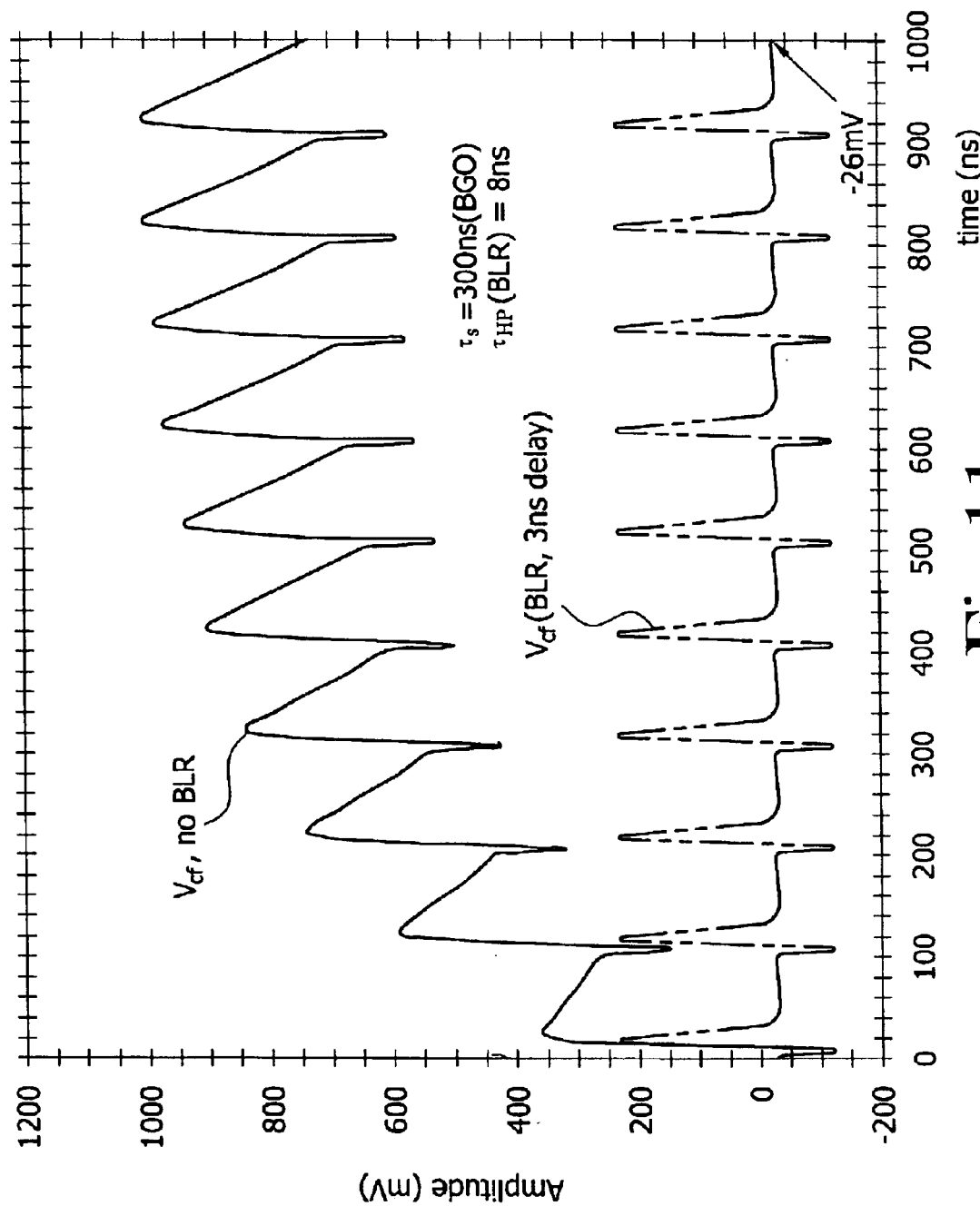
FIG. 11 shows pulse tail-cancellation by the CF BLR tail-cancel circuit of FIG. 4 and the severe pulse pileup when the BLR tail-cancel circuits are not used for BGO detector signals at a periodic count rate of 10 MHz.

FIG. 10 shows the arming signal located in FIG. 4 prior to the arming comparator. The arming signal is shown for BGO detector signals having a periodic count rate of 10 MHz, with and without the BLR tail-cancel circuits. FIG. 11 shows the CF signal located in FIG. 4 prior to the CF comparator for BGO detector signals at the same count rate, again, with and without the BLR tail-cancel circuits. BLR tail-cancel time constants of eight nanoseconds are used along with a three-nanosecond sampling delay for both the arming and CF BLR tail-circuits. Significant pulse pileup reduction is evident in both FIGS. 10 and 11. It is clear arming threshold discrimination (where signals in FIG. 10 exceeding a preset threshold would be discriminated) and zero-crossing CF timing (where the zero crossing of signals in FIG. 11 would be discriminated) would be impossible without the pulse tail-cancellation provided by the BLR tail-cancel circuits. Using the BLR tail-cancel circuits of the present invention, the baseline error is −25 millivolts or −12.5% of the 200-millivolt peak signal for the BGO arming signals shown in FIG. 10 and −26 millivolts or −10.8% of the 240-millivolt peak signal for the BGO CF signals shown in FIG. 11. These modest baseline errors permit successful CFD circuit operation at the very high input-signal count rate of 10 MHz.

The complete CFD circuit shown in FIG. 4 can be efficiently implemented in a custom, 0.5 μm fully-differential CMOS integrated circuit. Differential current-mode and voltage-mode circuits are used in the arming and CF channels to minimize even-order distortion, power supply noise coupling, noise coupling from other circuits, and systematic circuit offsets. Traditional single-ended CMOS logic circuits are used for the arming logic with the exception of flip flops that have been designed for low metastability to maximize logic performance for signals near the CFD threshold.

Figure 12:
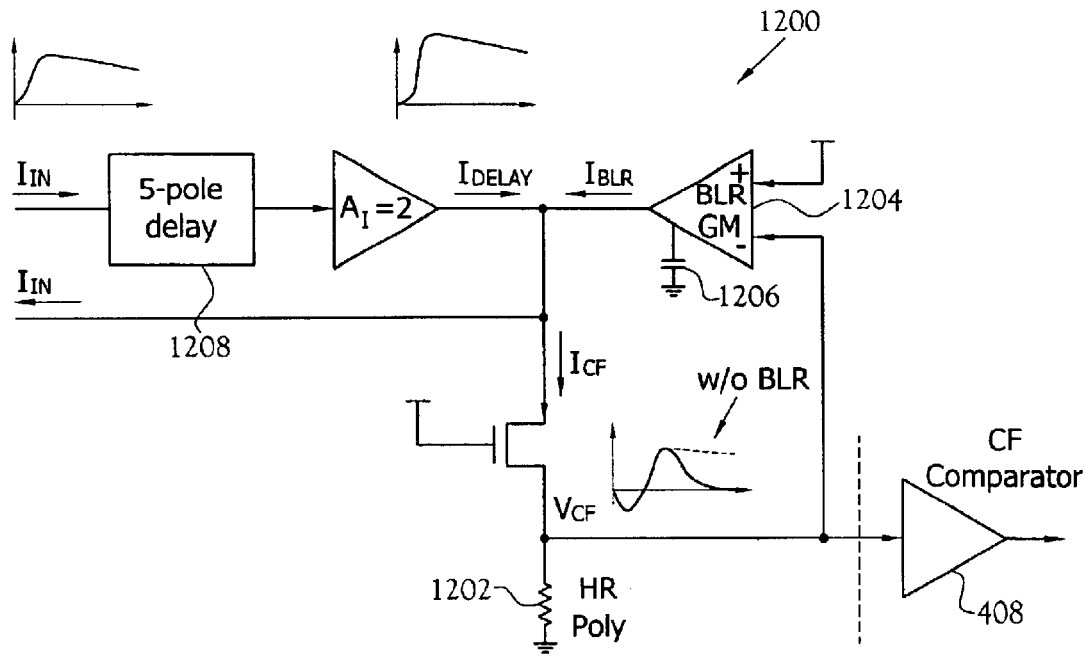
FIG. 12 shows a single-ended implementation of the CF non-delay-line, timing-shaping filter with BLR tail-cancel circuit.

FIG. 12 is a single-ended depiction of the differential circuit 1200 used in the CF non-delay-line, timing-shaping filter 402 and its associated BLR tail-cancel circuit 406. The detector input signal $I_{IN}$ (going left to right) is converted to multiple signal currents by an input transconductor and current mirror system (not shown). One signal current $I_{DELAY}$ is delayed and given a current gain of two. Another signal current $I_{IN}$ (going from right to left) is subtracted from the delayed current $I_{DELAY}$ giving an output CF current $I_{CF}$. The output CF current $I_{CF}$ is converted to a differential output voltage $V_{CF}$ by low-capacitance high-resistance polysilicon resistors 1202 (two of these since all signals are differential). The differential output voltage $V_{CF}$ is sampled by the CF BLR tail-cancel circuit that provides a correction current $I_{BLR}$ to cancel circuit dc offsets and the signal decay tail. The differential output voltage $V_{CF}$ provides an amplitude-independent zero crossing that is sensed by the CF comparator 408. As observed in both FIGS. 4 and 12, the CF signal decay tail appearing at the input of the CF comparator 408 is significantly shortened by the CF BLR tail-cancel circuit 406.

The BLR tail-cancel circuit of FIG. 12 consists of an operational transconductance amplifier (OTA) located at the input of the GM circuit block 1204. The current output of the OTA feeds an internal compensation capacitor 1206 shown connected to the GM circuit block 1204 that creates a correction voltage. The correction voltage is sensed by another OTA that provides the necessary BLR output correction current $I_{BLR}$ at the output of the GM circuit block 1204. Unlike the prior-art gated BLR circuit 300 used in a previous 2-μm PET front-end integrated circuit, the BLR tail-cancel circuits 406, 410 of the present invention operate with continuous-time, wideband, high-frequency negative feedback to provide simultaneous tail-cancellation for operation at high count rates. The input to the GM circuit block 1204 includes a passive RC delay circuit denoted as 508 in FIG. 5. The passive RC delay circuit 508 delays the sampling of the differential output voltage signal $V_{CF}$ such that there is little cancellation of the early part of the differential output voltage signal $V_{CF}$ that contains the critical zero-crossing timing information. Following this delay, the full negative feedback is applied to significantly reduce the duration of the signal tail. The signal at the positive input of the GM circuit block 1204 is connected to a reference baseline voltage that controls the baseline voltage level of the differential output voltage signal $V_{CF}$.

Circuitry for the arming BLR tail-cancel circuit 410 is similar to the circuitry shown in FIG. 12 except the signal delay 1208 and signal subtraction circuits, $I_{IN}$ (going from right to left), are omitted. In the arming BLR tail-cancel circuit 410, the input signal currents are summed with the BLR output currents with the differential arming voltage sensed by the BLR circuit. An integrated 8-bit analog-to-digital converter provides a deliberate CFD threshold offset at the plus input of the arming BLR GM. The threshold offset lowers the arming baseline by the selected CFD threshold such that the arming condition is met when the arming signal exceeds zero.

Those skilled in the art will recognize that negative feedback circuit of the present invention can be implemented using discrete electronic components, including resistors, bipolar and/or MOS transistors, commercial or custom operational amplifiers, operational transconductance amplifiers, amplifiers, or any other analog or digital integrated circuit components, subsystems, or systems; the substrate material for a discrete implementation may be a printed circuit board, a ceramic or other substrate, an integrated-circuit substrate for circuits know in the art as multi-chip modules (MCM's), or any other circuit substrate material. Further, the negative feedback circuit can be implemented in bulk CMOS technology as illustrated in the aforementioned embodiment, silicon-on-insulator (SOI) CMOS technology, bipolar transistor technology, biCMOS technology which is a combination of CMOS and bipolar technology, or any existing, emerging, or yet undiscovered integrated-circuit fabrication technology including molecular, nanotechnology, or large scale devices fabricated in any combination of inorganic and organic materials without departing from the scope and spirit of the present invention.

The negative-feedback circuit for baseline restoration and pulse tail-cancellation has been shown and described herein both generally and as applied to a constant fraction discriminator. Those skilled in the art will recognize that the general negative-feedback circuit can be used in various applications including time pickoff circuits applied with nuclear radiation detectors used in positron emission tomography (PET) medical imaging or other applications, and known or yet unknown physical measurements of any kind where time pickoff is required without departing from the scope and spirit of the present invention.

The negative-feedback circuit can be adapted to utilize any combination of signal voltages, signal currents, or both signal voltages and currents without departing from the scope and spirit of the present invention. The negative-feedback circuit can utilize any combination of single-ended signals, which are signals where a single voltage or current is used to represent a single signal, any combination of differential signals, which are signals where two voltages and/or two currents represent a single signal, or any combination of single-ended or differential signals without departing from the scope and spirit of the present invention.

While the present invention has been illustrated by description of several embodiments and while the illustrative embodiments have been described in detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept.

Having thus described the aforementioned invention, I claim:

1. A circuit for dynamically reducing the width of an input signal occurring at a high count rate while preserving early time information necessary for accurate time discrimination with respect to an occurrence time of the input signal, the input signal having a leading edge followed by a decaying tail component, said circuit comprising:

a means for combining the input signal with a correction signal to produce an output signal;

a means for comparing said output signal to a reference signal, for producing an error signal proportional to a difference between said output signal and said reference signal; and a means for sampling said error signal and generating said correction signal related to said error signal;

whereby said correction signal provides negative feedback providing dynamic cancellation or reduction of pulse width of the decaying tail component while preserving the early time information necessary for accurate discrimination of the occurrence time of the leading edge of the of input signal.

2. The circuit of claim 1 wherein said reference signal is selected from the group consisting of a threshold reference for level discrimination and a dc baseline level for zero-crossing timing discrimination.

3. The circuit of claim 1 wherein said output signal remains equal to said reference signal on average, thus correcting for signal baseline errors due to varying input signal count rate and dc baseline errors due to device mismatches and other implementation errors.

4. The circuit of claim 1 further comprising a means for reducing leading-edge signal loss by retaining said leading edge in said output signal.

5. The circuit of claim 4 wherein said means for reducing leading-edge signal loss is a means for delaying sampling of said output signal.

6. The circuit of claim 1 wherein each of said plurality of input signals is an arbitrary fixed-shape signal having a varying amplitude.

7. The circuit of claim 1 wherein said decaying tail component is an exponentially decaying signal.

8. The circuit of claim 1 further comprising a means for shaping each of said plurality of input signals into a bipolar signal having a zero-crossing time that is independent of the input signal amplitude.

9. The circuit of claim 8 wherein said means for shaping each of said plurality of input signals into a bipolar signal having a zero-crossing time that is independent of the input signal amplitude is a constant fraction shaping filter.

10. The circuit of claim 1 further comprising a means for threshold level discrimination.

11. A continuous-time negative feedback circuit for use in a constant fraction discriminator, said continuous-time negative feedback circuit for dynamically reducing the width of a high count rate input signal having a leading edge followed by a slowly decaying tail component while preserving early time information necessary for accurate time discrimination with respect to an occurrence time of the input signal, said continuous-time negative feedback circuit comprising:

a transconductor having a first input and a second input wherein an output signal is applied to said first input and a reference signal is applied to said second input, said transconductor producing an output signal based on the difference between said output signal and said reference signal;

a capacitance having a voltage based on said transconductor output signal, said capacitance generating a correction signal related to said capacitance voltage; and a differencing circuit having a first input and a second input wherein an input signal is applied to said first input and said correction signal is applied to said second input, said differencing circuit producing said output signal which is said input signal corrected by said correction signal;

whereby said continuous-time negative feedback circuit provides baseline restoration and pulse tail-cancellation to allow for high count rate operation and accurate time pickoff.

12. The continuous-time negative feedback circuit of claim 11 wherein said reference signal selected from the group consisting of a threshold reference for level discrimination and a dc baseline level for zero-crossing timing discrimination.

13. The continuous-time negative feedback circuit of claim 11 wherein said correction signal holds said output signal at said reference voltage on average thereby effectively canceling errors from sources including baseline dc shift due to changing signal count rates and baseline dc errors due to implementation device mismatches.

14. The continuous-time negative feedback circuit of claim 11 wherein said correction signal reduces the input signal delay tail component in said output signal thereby allowing signal processing at high count rates.

15. The continuous-time negative feedback circuit of claim 11 wherein said correction voltage controls said output signal to provide dynamic cancellation of the slowly decaying tail component while largely preserving the leading edge.

16. The continuous-time negative feedback circuit of claim 11 further comprising a delay circuit in communication between said differencing circuit and said transconductor to delay signal correction thereby largely preserving the leading edge while canceling the slowly decaying tail component.

17. The continuous-time negative feedback circuit of claim 11 wherein said capacitance is tunable to accommodate changing circuit requirements.

18. The continuous-time negative feedback circuit of claim 11 wherein said continuous-time negative feedback circuit is implemented in an integrated-circuit technology selected from the group comprising bulk CMOS technology, silicon-on-insulator CMOS technology, bipolar transistor technology, biCMOS technology, molecular technology, nanotechnology, inorganic large scale device technology, and organic large scale device technology.

19. The continuous-time negative feedback circuit of claim 11 is implemented using any combination of single-ended signals (one wire per signal) or differential signals (two wires per signal) using any combination of voltage and/or current signals.

20. A continuous-time baseline-restoration circuit for use in a constant fraction discriminator operating on a plurality of input signals occurring at a high count rate, each of the plurality of input signals having a leading edge followed by a decaying tail component, said continuous-time baseline-restoration circuit comprising:

a means for combining each of the plurality of input signals with a correction signal to produce an output signal;

a means for comparing said output signal to a reference signal and for producing an error signal proportional to a difference between said output signal and said reference signal; and a means for sampling said error signal and generating said correction signal related to said error signal;

whereby said continuous-time baseline restoration circuit corrects for baseline shift associated with varying input signal count rates and device mismatch errors in integrated circuit implementations while providing simultaneous reduction in width or duration of the decaying tail component of each of the plurality of input signals with minimal effect on said leading edge of each of said plurality of inputs signals;

thereby allowing the constant fraction discriminator to operate at very high count rates while obtaining accurate zero-crossing time discrimination and arming threshold discrimination.

* * * * *